(12) United States Patent
Chang

(10) Patent No.: US 9,496,284 B2
(45) Date of Patent: Nov. 15, 2016

(54) DISPLAY PANEL AND DISPLAY APPARATUS INCLUDING THE SAME

(71) Applicant: Innolux Corporation, Miaoli County (TW)

(72) Inventor: Ming-Chieh Chang, Miaoli County (TW)

(73) Assignee: INNOLUX CORPORATION, Miaoli County (TW)

(*) Notice: Subject to any disclaimer, the term of this patent is extended or adjusted under 35 U.S.C. 154(b) by 246 days.

(21) Appl. No.: 14/513,561

(22) Filed: Oct. 14, 2014

(65) Prior Publication Data
US 2015/0131020 A1 May 14, 2015

(30) Foreign Application Priority Data
Nov. 8, 2013 (TW) .............................. 102140769 A

(51) Int. Cl.
| G02F 1/136 | (2006.01) |
| H01L 27/12 | (2006.01) |
| G02F 1/1368 | (2006.01) |
| H01L 29/423 | (2006.01) |
| H01L 29/66 | (2006.01) |
| H01L 29/786 | (2006.01) |
| H01L 27/32 | (2006.01) |

(52) U.S. Cl.
CPC ......... *H01L 27/1225* (2013.01); *G02F 1/1368* (2013.01); *H01L 29/42384* (2013.01); *H01L 29/66969* (2013.01); *H01L 29/78642* (2013.01); *H01L 29/78693* (2013.01); *H01L 27/3262* (2013.01)

(58) Field of Classification Search
None
See application file for complete search history.

(56) References Cited

U.S. PATENT DOCUMENTS

| 6,566,714 | B2 | 5/2003 | Deane et al. |
| 7,265,393 | B2 | 9/2007 | Schuele et al. |
| 8,941,106 | B2 * | 1/2015 | Hsu ........................ H01L 33/08 257/43 |
| 2005/0258427 | A1 | 11/2005 | Chan et al. |
| 2006/0175609 | A1 | 8/2006 | Chan et al. |
| 2011/0127526 | A1 * | 6/2011 | Kawae .............. H01L 29/78606 257/43 |

* cited by examiner

*Primary Examiner* — Richard Kim
(74) *Attorney, Agent, or Firm* — WPAT, PC; Justin King

(57) ABSTRACT

This disclosure provides a display panel and a display apparatus using the display panel. The display panel includes: a substrate; a first electrode formed on the substrate; a first insulation layer formed on the first electrode; a gate electrode formed on the first insulation layer and having an inclined lateral plane; a second insulation layer formed on the gate electrode and covering the inclined lateral plane; an active layer formed on the second insulation layer corresponding to the inclined lateral plane and electrically connected to the first electrode; and a second electrode electrically connected to the active layer; wherein the inclined lateral plane has an angle of between 30 and 90 degrees relative to the surface of the substrate.

9 Claims, 11 Drawing Sheets

DISPLAY PANEL AND DISPLAY APPARATUS INCLUDING THE SAME

This application claims the benefit of Taiwan application Serial No. 102140769, filed on Nov. 8, 2013, and the disclosure of which is incorporated by reference herein in its entirety.

TECHNICAL FIELD

The present disclosure relates to a display panel, and more particularly, to a display apparatus including the display panel.

TECHNICAL BACKGROUND

A liquid crystal display panel includes two corresponding glass substrates, a thin-film transistor (TFT) substrate and a color filter (CF) substrate. Conventionally, the TFT on the TFT substrate comprise source contact, active layer and drain contact arranged laterally to form a planar device structure, in which the active layer or the conducting channel between the drain and source contacts is horizontal to the TFT substrate. Minimum length of the conducting channel is limited by the exposure resolution of the photolithography tool that is used. Current state-of-the-art photolithography doesn't allow the critical dimension (CD) of the conducting channel down to 3 µm or less.

The current trend of flat display panel is towards high resolution, so operational performance of the active switching devices will be more and more critical. For example, switching speed of the TFT has to be improved so as to be used in the display panel with a frame rate more than 120 Hz and a resolution more than 320 pixels per inch (PPI). To raise the switching frequency and to enlarge aperture ratio, length of the conducting channel in TFT must be further shortened. However, the planar-device-structure TFT is limited by the CD of the fabrication process. Therefore, it is in need to develop a new display panel.

TECHNICAL SUMMARY

According to one aspect of the present disclosure, one embodiment provides a display panel, which includes: a substrate; a first electrode formed on the substrate; a first insulation layer formed on the first electrode; a gate electrode formed on the first insulation layer and having an inclined lateral plane; a second insulation layer formed on the gate electrode and covering the inclined lateral plane; an active layer formed on the second insulation layer corresponding to the inclined lateral plane and electrically connected to the first electrode; and a second electrode electrically connected to the active layer; wherein the inclined lateral plane has an angle of between 30 and 90 degrees relative to the surface of the substrate.

In one embodiment, the second electrode is located between the second insulation layer and the active layer.

In one embodiment, the active layer is located between the second insulation layer and the second electrode.

In one embodiment, the active layer is formed of indium gallium zinc oxide (IGZO) or indium zinc oxide (IZO).

In one embodiment, the display panel further includes a first via hole through the first insulation layer and the second insulation layer to expose the first electrode.

In one embodiment, the display panel further includes: a third insulation layer formed on the second electrode and covering the active layer; and a pixel electrode formed on the substrate and covering the third insulation layer; wherein a second via hole penetrates through the third insulation layer to expose the second electrode, and the pixel electrode is electrically connected to the second electrode.

In one embodiment, the gate electrode includes a first gate metal layer, a second gate metal layer, and a fourth insulation layer between the first gate metal layer and the second gate metal layer.

In one embodiment, the display panel may be used in liquid crystal display (LCD) apparatus, organic light-emitting diode (OLED) display apparatus or plasma display panel (PDP) apparatus.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For further understanding and recognizing the fulfilled functions and structural characteristics of the disclosure, several exemplary embodiments cooperating with detailed description are presented as the following. Reference will now be made in detail to the preferred embodiments, examples of which are illustrated in the accompanying drawings.

In the following description of the embodiments, it is to be understood that when an element such as a layer (film), region, pattern, or structure is stated as being "on" or "under" another element, it can be "directly" on or under another element or can be "indirectly" formed such that an intervening element is also present. Also, the terms such as "on" or "under" should be understood on the basis of the drawings, and they may be used herein to represent the relationship of one element to another element as illustrated in the figures. It will be understood that this expression is intended to encompass different orientations of the elements in addition to the orientation depicted in the figures, namely, to encompass both "on" and "under". In addition, although the terms "first", "second" and "third" are used to describe various elements, these elements should not be limited by the term. Also, unless otherwise defined, all terms are intended to have the same meaning as commonly understood by one of ordinary skill in the art.

Figure 1:
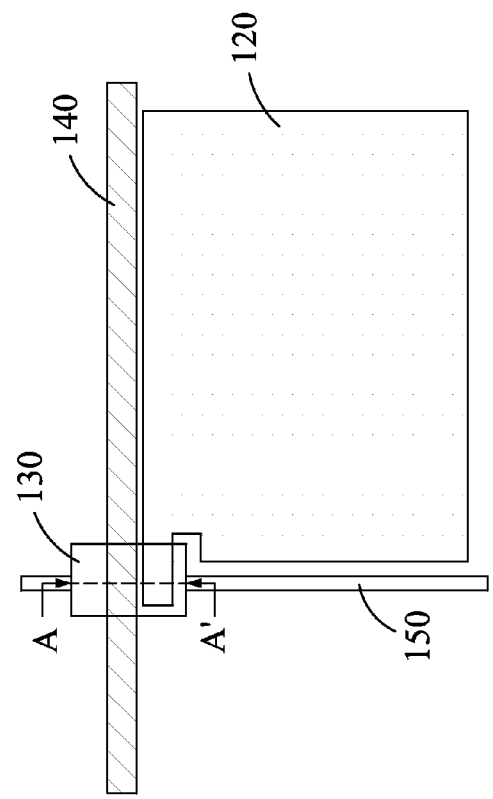
FIG. 1 schematically shows a plan view of a display panel having an array of pixels according to one embodiment of the present disclosure.

FIG. 1 schematically shows a plan view of a display panel 100 having an array of pixels according to one embodiment of the present disclosure. For the sake of clarity and convenience, only one of the pixels is illustrated in the figure, where the display panel 100 includes a pixel electrode 120, a thin-film transistor (TFT) 130, a scan line 140 and a data line 150. The display panel 100 uses the TFT 130 as its switching element. In the whole layout of the display panel, the scan lines 140 and the data lines 150 are horizontal row and vertical column wires, respectively, and the pixels are arranged in a matrix with m rows and n columns A gate terminal of each of the TFTs 130 is connected to one of the scan lines 140, and a drain terminal of each of the TFTs 130 is connected to one of the data line 150.

Figure 2:
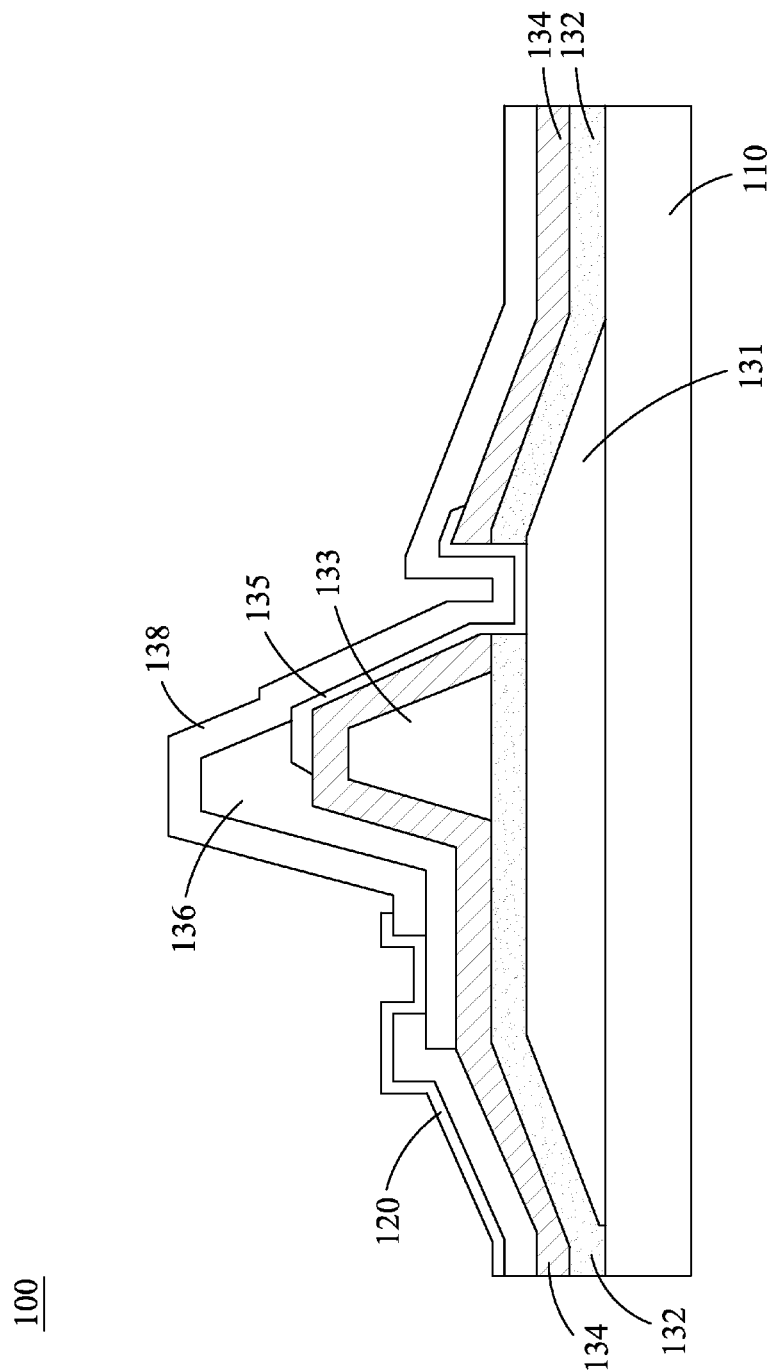
FIG. 2 is a cross-sectional view of the display panel taken along the line A-A' of FIG. 1.

FIG. 2 is a cross-sectional view of the display panel 100 taken along the line A-A' of FIG. 1. The display panel 100 includes a substrate 110, a first electrode 131, a first insulation layer 132, a gate electrode 133, a second insulation layer 134, an active layer 135 and a second electrode 136. The first electrode 131 and the second electrode 136 may act as drain and source terminals of the TFT 130. In this embodiment, the first electrode 131 is to be the drain terminal and the second electrode 136 is to be the source terminal. As shown in FIG. 2, the first electrode 131 is formed on the substrate 110, the first insulation layer 132 is then formed on the first electrode 131, the gate electrode 133 is then formed on the first insulation layer 132 and spaced from the first electrode 131, the second insulation layer 134 is then formed on the gate electrode 133 and covering both the gate electrode 133 and the first insulation layer 132, the active layer 135 is then formed on the second insulation layer 134, and the second electrode 136 is then formed on the second insulation layer 134 and electrically connected to the active layer 135. A via hole is formed through the first insulation layer 132 and the second insulation layer 134, so that the active layer 135 can be electrically connected to the first electrode 131. The active layer 135 may act as a semiconductor conducting channel to connect the first electrode 131 and second electrode 136 electrically. Thereby, the combination of the gate electrode 133, the active layer 135, the first electrode 131 and the second electrode 136 forms a vertical transistor structure, which is the TFT 130 as shown in FIG. 1. The second electrode (source) 136, the active layer 135 and the first electrode (drain) 131 are stacked on the substrate 110 vertically to form a transistor with a non-horizontal conducting channel. In contrast, the prior-art TFT has its source contact, active layer and drain contact arranged laterally to form a planar device structure, in which the active layer or the conducting channel between the drain and source contacts is horizontal to the substrate.

The substrate 110 is used to support the pixel electrode 120, the TFT 130, the scan line 140 and the data line 150. The substrate 110 may be made of glass, polymer, acrylic, glass fiber, metal, or the other flexible or rigid material, either transparent or opaque. In this embodiment, the substrate 110 is formed of glass. Since the TFTs 130 are to be formed on the substrate 110, the substrate 110 can be referred to as "TFT substrate" in the display industry terminology.

In the display panel 100, the pixels are arranged on the substrate 110 in a matrix form. For a color display, each pixel can be divided into red, green and blue sub-pixels. As shown in FIG. 1, the scan lines 140 are horizontal wires configured for delivering the scanning signals from a scan driver (not shown) to drive the TFTs 130 in sequence. The data lines 150 are vertical wires configured for delivering the display data signals from a data driver (not shown) to drive the pixels. The so-called sub-pixel can be defined at the intersection of each scan line 140 and each data line 150. The gate terminal of each TFT 130 is connected to one of the scan lines 140, and its drain terminal is connected to one of the data line 150. The sub-pixel can be switched on or off according to the scanning signal, the data signal and the voltage level of its pixel electrode.

Figure 3:
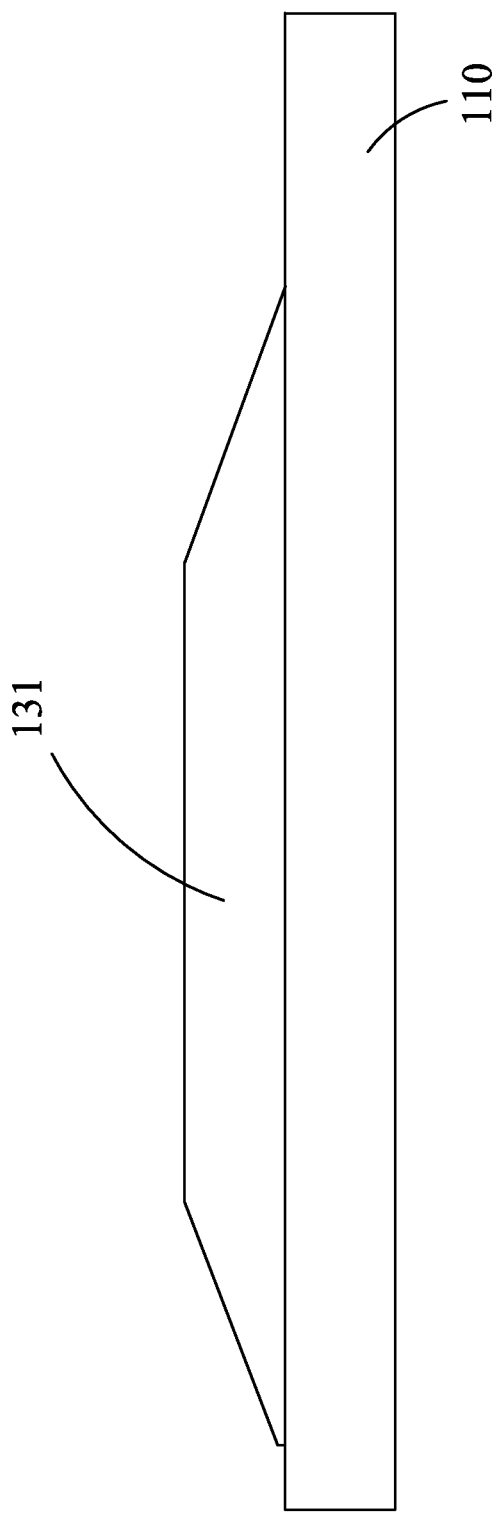
FIGS. 3 to 8 are cross-sectional views of the TFT of the display panel according to one embodiment in different steps of fabrication process.

FIGS. 3 to 8 are cross-sectional views of the TFT 130 of the display panel 100 according to one embodiment in different steps of fabrication process. At first, a metal layer can be formed on the substrate 110 by using a proper deposition method, such as evaporation and sputtering deposition. The metal layer is then patterned by using the photolithography and a proper (dry or wet) etching method to define the first electrode 131 of the TFT 130 as shown in FIG. 3. The metal layer can be made of aluminum (Al), copper (Cu), chromium (Cr), gold (Au), molybdenum (Mo), Al—Nd (aluminum-neodymium) alloy, Mo—W (molybdenum-tungsten) alloy, or a stack of metal films like Mo/Al/Mo; but the embodiment is not limited thereto.

Figure 4:
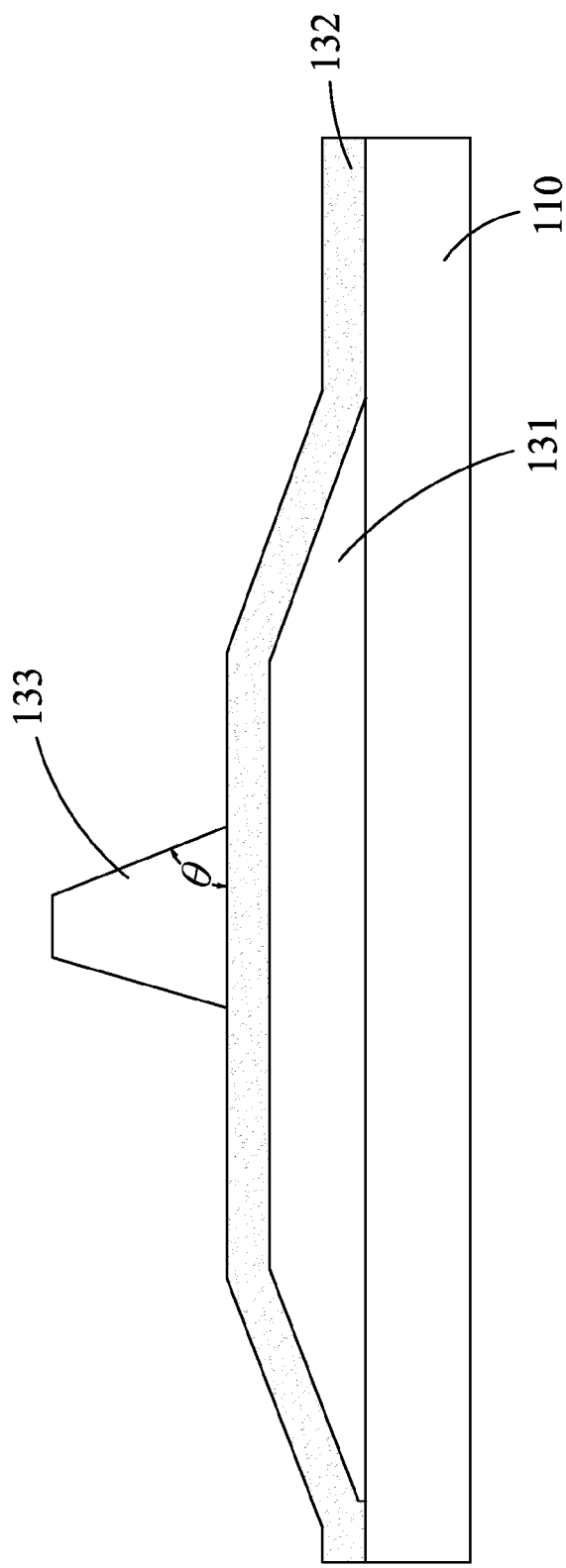

Next, the first insulation layer 132 can be formed on the first electrode 131 by using a proper deposition method, such as physical vapor deposition (PVD) or chemical vapor deposition (CVD), as shown in FIG. 4. The first insulation layer 132 covers the first electrode 131 to protect it and disconnect it from the gate electrode 133 to be formed later. The first insulation layer 132 can be made of silicon nitride ($SiN_x$), silicon oxynitride ($SiO_xN_y$), aluminum oxide ($AlO_x$), silicon oxide ($SiO_x$), or titanium oxide ($TiO_x$), wherein the subscripts x and y denote the alloy mole ratios; but the embodiment is not limited thereto.

Next, another metal layer can be formed on the first insulation layer 132 by using a proper deposition method, such as evaporation and sputtering deposition. The metal layer is then patterned by using the photolithography and a proper (dry or wet) etching method to define the gate electrode 133 of the TFT 130 as shown in FIG. 4. The gate electrode 133 is spaced from the first electrode 131. The gate electrode 133 can be made of Al, Cu, Cr, Au, Mo, Al—Nd alloy, Mo—W alloy, or a stack of metal films like Mo/Al/Mo; but the embodiment is not limited thereto. As recited in the foregoing paragraph, the TFT 130 has a vertical device structure, in which the second electrode 136, the active layer 135 and the first electrode 131 are stacked vertically. The gate electrode 133 is disposed on the first electrode 131, and the width of the gate electrode 133 is less than that of the first electrode 131. The gate electrode 133 has an inclined lateral plane, for example, the right-hand one, which has a proper angle θ relative to the surface of the substrate 110. For the reason that the active layer 135 is to be formed on the lateral plane of the gate electrode 133, the angle θ between 30 and 90 degrees is used in the embodiment. If the lateral plane is too sharp, for example, the angle θ equal to 90 degrees, the deposition of the subsequent active layer 135 thereon is subject to defects. Otherwise, if the lateral plane is too gradual, for example, the angle θ less than 30 degrees, the active layer 135 may fail to have a shortened channel length which is what we expect from the vertically stacked TFT in the embodiment.

Figure 5:
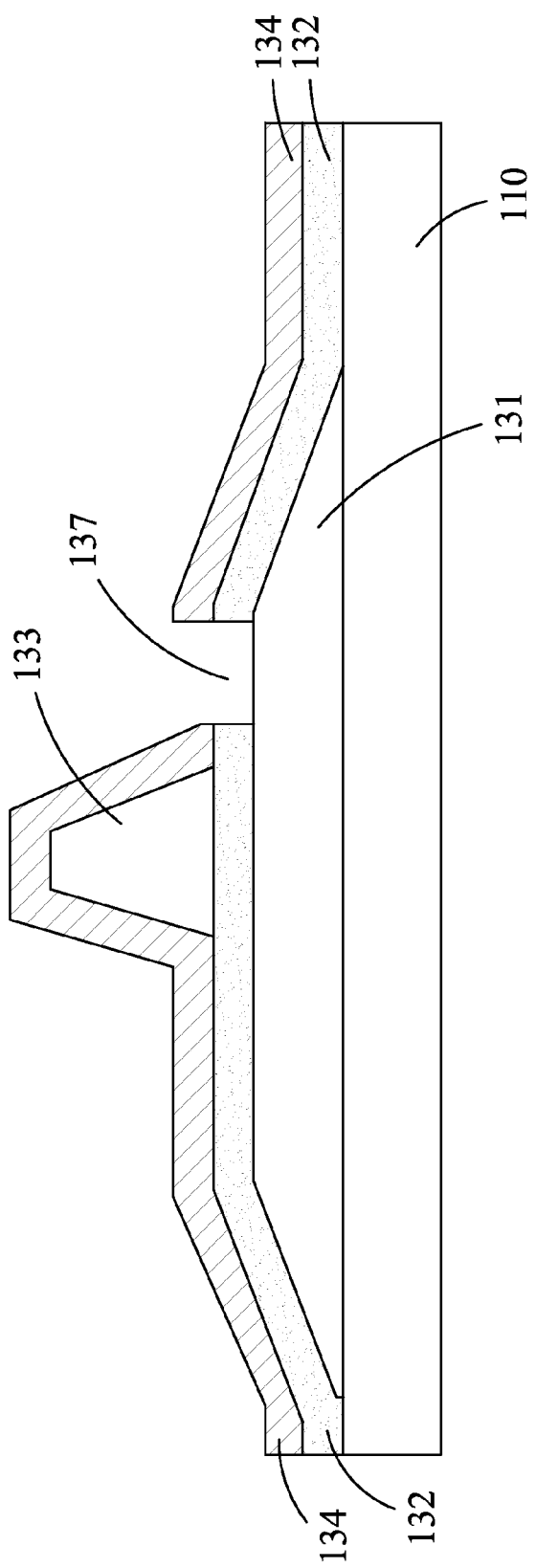

Next, the second insulation layer 134 can be formed on the gate electrode 133 by using a proper deposition method, such as physical vapor deposition (PVD) or chemical vapor deposition (CVD), as shown in FIG. 5. The second insulation layer 134 covers both the gate electrode 133 and the first insulation layer 132. The second insulation layer 134 acts as a gate insulator of the TFT 130 to disconnect the gate electrode 133 from the active layer 135 to be formed later as shown in FIG. 2. The second insulation layer 134 can be made of silicon nitride ($SiN_x$), silicon oxynitride ($SiO_xN_y$), aluminum oxide ($AlO_x$), silicon oxide ($SiO_x$), or titanium oxide ($TiO_x$), wherein the subscripts x and y denote the alloy mole ratios; but the embodiment is not limited thereto. Next, the first insulation layer 132 and the second insulation layer 134 are then patterned by using the photolithography and a proper (dry or wet) etching method to define a first via hole 137 which penetrates through the first insulation layer 132 and the second insulation layer 134 to expose the first electrode 131, as shown in FIG. 5. The first via hole 137 may act as a contact hole through which the first electrode 131 is connected to the active layer 135 to be formed later.

Figure 6:
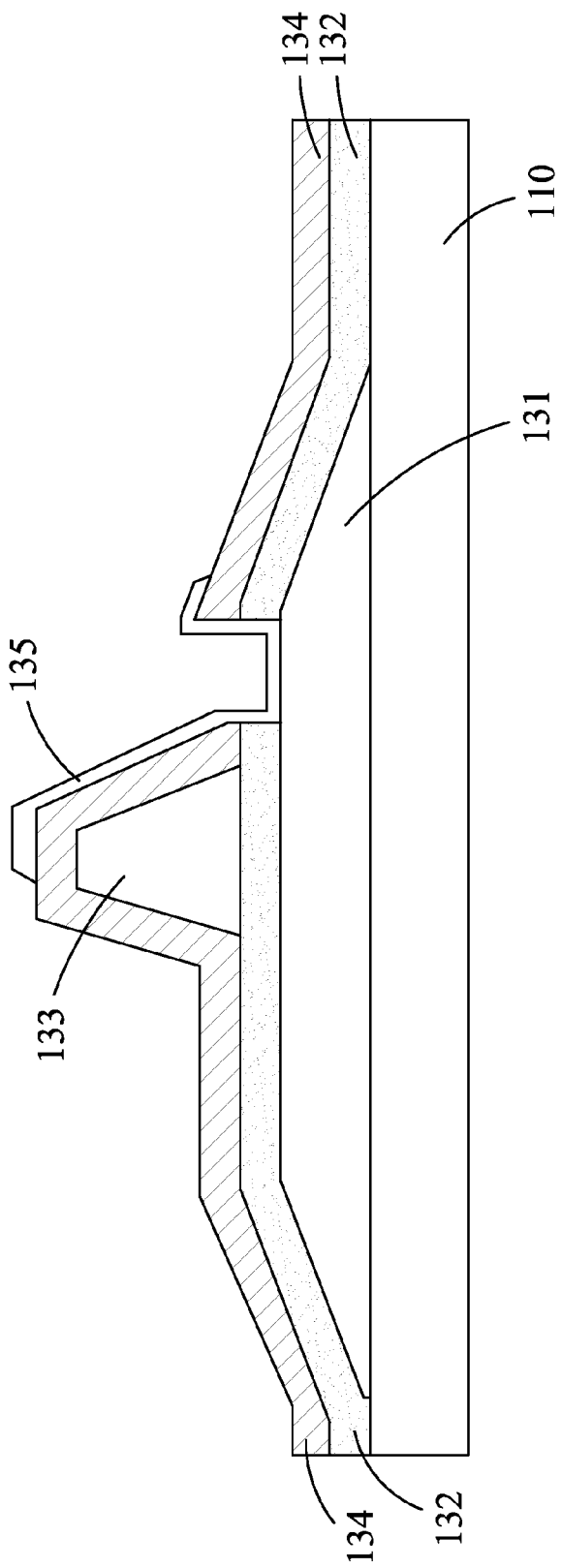

Next, the active layer 135 can be formed on the second insulation layer 134 by using a proper deposition method, such as physical vapor deposition (PVD) or chemical vapor deposition (CVD). The active layer 135 is confirmally deposited on the bottom and side walls of the first via hole 137 as shown in FIG. 6, so that the active layer 135 is connected to the first electrode 131. Then, the active layer 135 is patterned by using the photolithography and a proper etching method to define a conducting channel region for the TFT 130, as shown in FIG. 6. After the pattern processing, the active layer 135 covers the right-hand lateral plane and a part of the top plane of the second insulation layer 134, the side walls of the first via hole 137 and the exposure area of the first electrode 131, so that the connection of the first electrode 131 and the active layer 135 can be obtained. The active layer 135 can be made of proper semiconductor material such as silicon (Si), germanium (Ge), and oxide semiconductor material with high charged-carrier mobility, like indium gallium zinc oxide (IGZO), indium zinc oxide (IZO), indium tin zinc oxide (ITZO), indium gallium oxide (IGO), indium tin oxide (ITO), zinc oxide (ZnO) and tin oxide (SnO); but the embodiment is not limited thereto. A TFT with an active layer of oxide semiconductor can also be termed as "Oxide TFT", which will be described in detail later.

Figure 7:
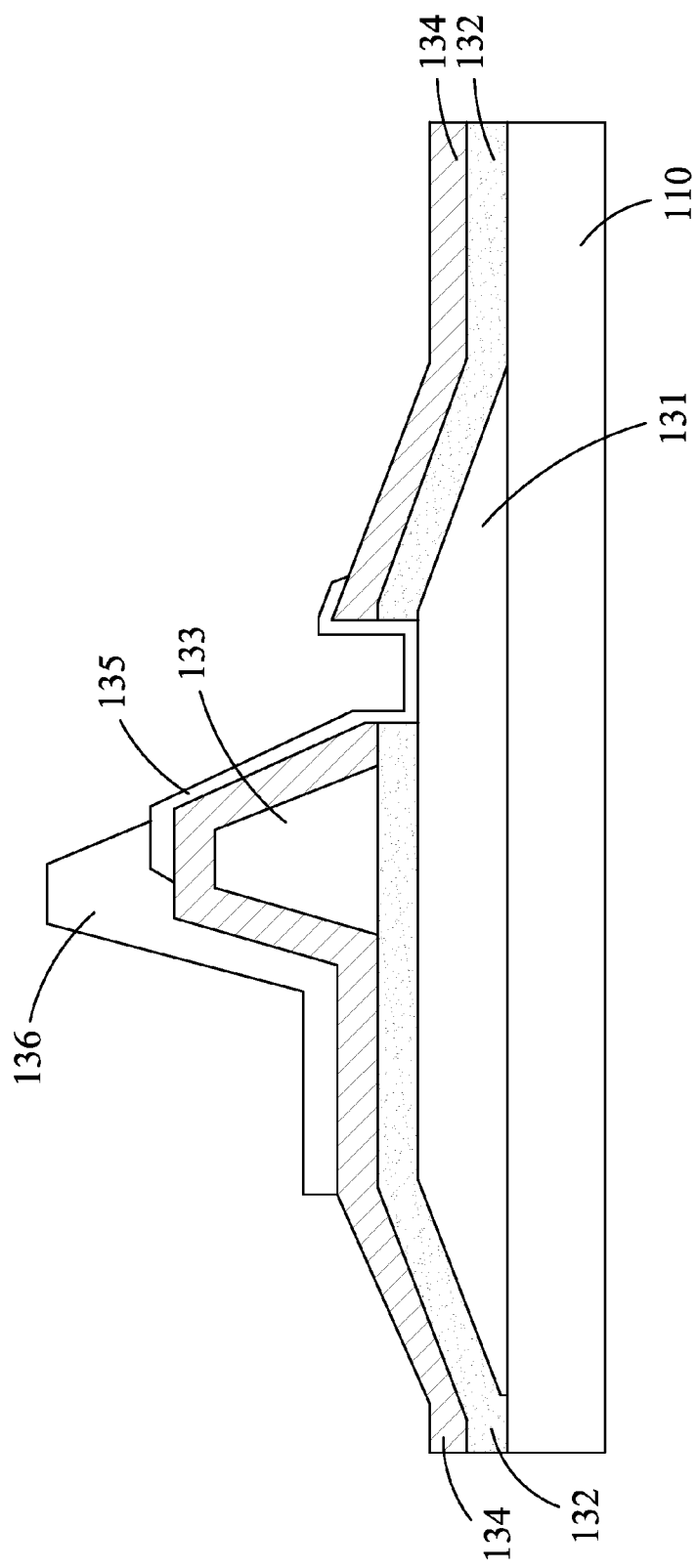

Next, another metal layer can be formed on the second insulation layer 134 and the active layer 135 by using a proper deposition method, such as evaporation and sputtering deposition. The metal layer is then patterned by using the photolithography and a proper (dry or wet) etching method to define the second electrode 136 of the TFT 130 as shown in FIG. 7. The second electrode 136 covers the left-hand lateral plane and the top plane of the second insulation layer 134 (or the gate electrode 133) and a part of the first electrode 131, so that the active layer 135 is connected to the second electrode 136. The width of the second electrode 136 is less than that of the first electrode 131 and slightly more than that of the gate electrode 133, so that the second electrode 136, the active layer 135 and the first electrode 131 tend to vertically stacked structure to be a vertical channel TFT 130. The second electrode 136 can be made of Al, Cu, Cr, Au, Mo, Al—Nd alloy, Mo—W alloy, or a stack of metal films like Mo/Al/Mo; but the embodiment is not limited thereto.

Thus far, the main body of the vertical-device-structure TFT 130 has been formed as shown in FIG. 7. It includes the gate electrode 133, the first electrode (drain) 131, the second electrode (source) 136 and the active layer 135, which are stacked vertically to form a transistor with a non-horizontal conducting channel. The device structure is totally different from the planar-device-structure TFT, in which source contact, active layer and drain contact are arranged laterally. In the embodiment, the length of the conducting channel in the active layer 135 can be estimated to be the sum of thicknesses of the first insulation layer 132, the gate electrode 133 and the second insulation layer 134. According to the existing fabrication process of semiconductor device, an insulation layer is about 100 to 200 nm and a metal electrode layer is 180 to 250 nm in thickness; consequently, the conducting channel of the TFT 130 can be reduced to be 500 nm or less in length. As compared to the planar-device-structure TFT, which has a conducting channel length more than 3 μm, the size of the conducting channel or the active layer can be considerably reduced according the vertically structured TFT of the embodiment.

Figure 8:
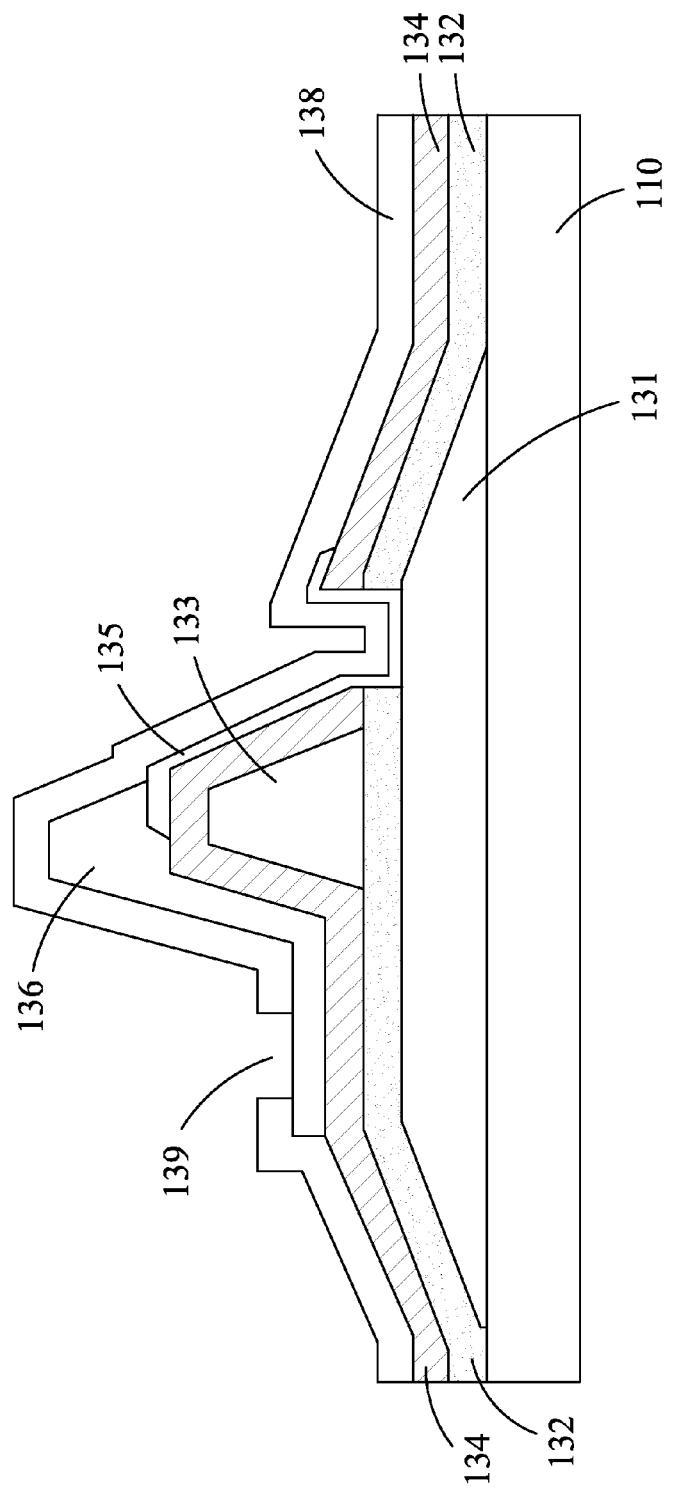

In order to protect the main body of the TFT 130 and connect it to its corresponding pixel electrode, a third insulation layer 138 can be formed on the second electrode 136, the active layer 135 and the second insulation layer 134 by using a proper deposition method, such as physical vapor deposition (PVD) or chemical vapor deposition (CVD). The third insulation layer 138 acts as a protective layer to protect the second electrode 136 and the active layer 135, as shown in FIG. 8. The third insulation layer 138 can be made of silicon nitride ($SiN_x$), silicon oxynitride ($SiO_xN_y$), aluminum oxide ($AlO_x$), silicon oxide ($SiO_x$), or titanium oxide ($TiO_x$), wherein the subscripts x and y denote the alloy mole ratios; but the embodiment is not limited thereto. Next, the third insulation layer 138 is then patterned by using the photolithography and a proper etching method to define a second via hole 139 which penetrates through the third insulation layer 138 to expose the second electrode 136, as shown in FIG. 8. The second via hole 139 may act as a contact hole through which the second electrode 136 is connected to the pixel electrode 120 in the pixel.

Figure 9:
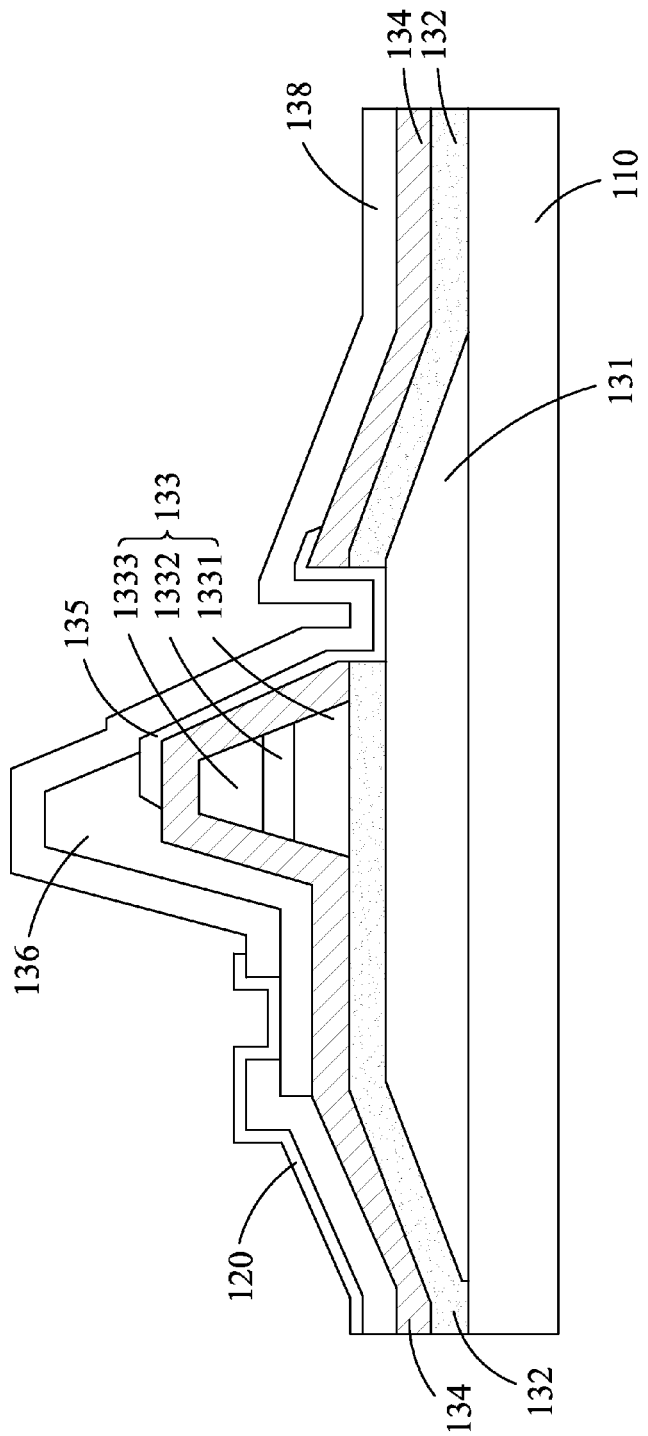
FIG. 9 is a cross-sectional view of the display panel taken along the line A-A' of FIG. 1 according to another embodiment.

Finally, a transparent conductive layer can be formed on the third insulation layer 138 by using a proper deposition method such as physical vapor deposition (PVD) or chemical vapor deposition (CVD), and then patterned by using the photolithography and a proper (dry or wet) etching method to define the pixel electrode 120 of the pixel as shown in FIG. 9. Thus, the layout diagram and cross-sectional view of the display panel 100 having the pixel can be referred to FIGS. 1 and 2, respectively. The pixel electrode 120 can be made of transparent conductive material such as indium tin oxide (ITO), indium zinc oxide (IZO) and zinc oxide (ZnO); but the embodiment is not limited thereto.

Moreover, in order to restrain leakage current when the TFT 130 is reverse biased, a multi-layer electrode can be used to realize the gate electrode 133. FIG. 9 is a cross-sectional view of the display panel 200 taken along the line A-A' of FIG. 1, according to another embodiment. The gate electrode 133 may include a first gate metal layer 1331, a fourth insulation layer 1332 formed on the first gate metal layer 1331, and a second gate metal layer 1333 formed on the fourth insulation layer 1332. The display panel 200 of the present embodiment has similar composition and structure to the display panel 100 of the previous embodiment, and the redundancies will not be described again. The first gate metal layer 1331 and the second gate metal layer 1333 can be made of Al, Cu, Cr, Au, Mo, Al—Nd alloy, Mo—W alloy, or a stack of metal films like Mo/Al/Mo; but the embodiment is not limited thereto. The fourth insulation layer 1332 can be made of silicon nitride (SiN$_x$), silicon oxynitride (SiO$_x$N$_y$), aluminum oxide (AlO$_x$), silicon oxide (SiO$_x$), or titanium oxide (TiO$_x$), wherein the subscripts x and y denote the alloy mole ratios; but the embodiment is not limited thereto. The second gate metal layer 1333 is smaller than the first gate metal layer 1331 in width. By thickening the fourth insulation layer 1332, the reverse-biased leakage current can be properly diminished in the TFT 130.

Figure 10:
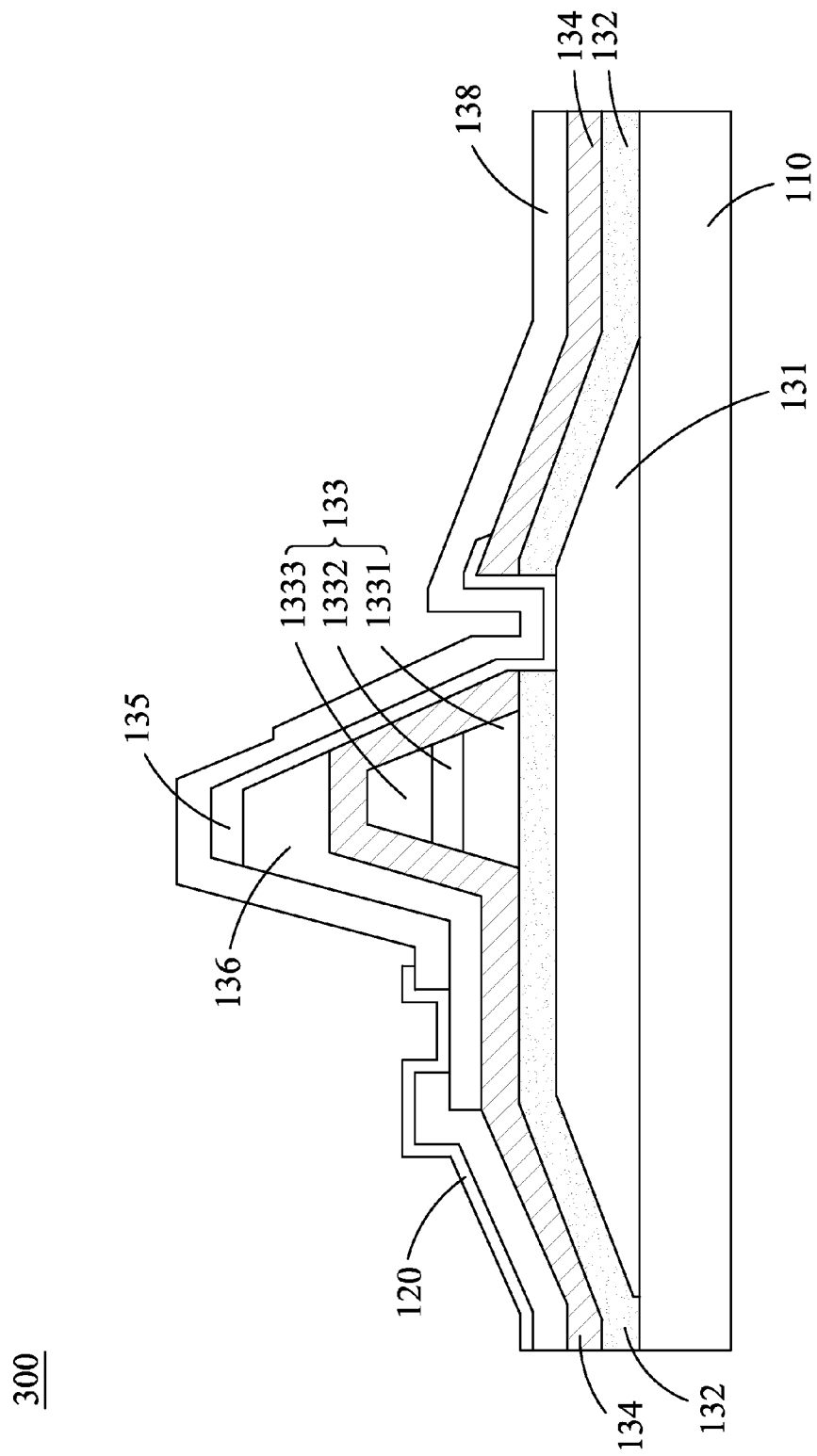
FIG. 10 is a cross-sectional view of the display panel taken along the line A-A' of FIG. 1 according to another embodiment.

Moreover, amorphous indium gallium zinc oxide (IGZO) or indium zinc oxide (IZO), with high charged-carrier mobility, can be used to form the active layer 135. However, such oxide semiconductor material is subject to the fabrication process after its participation and tends to be damaged or induce defects to downgrade electrical performance of the TFT 130. FIG. 10 is a cross-sectional view of the display panel 300 taken along the line A-A' of FIG. 1 according to another embodiment, in which the second electrode 136 is formed on the second insulation layer 134 before the active layer 135 is formed on the second electrode 136. That is, the steps of FIG. 6 and FIG. 7 in the above embodiment are switched to get the TFT 130 of the display panel 300 in the present embodiment. The display panel 300 of the present embodiment has similar composition and structure to the display panel 100 of the previous embodiment, and the redundancies will not be described again. Since the active layer 135 is formed after the second electrode 136, the IGZO or IZO in the active layer 135 can avoid the metallization process of the second electrode 136.

Figure 11:
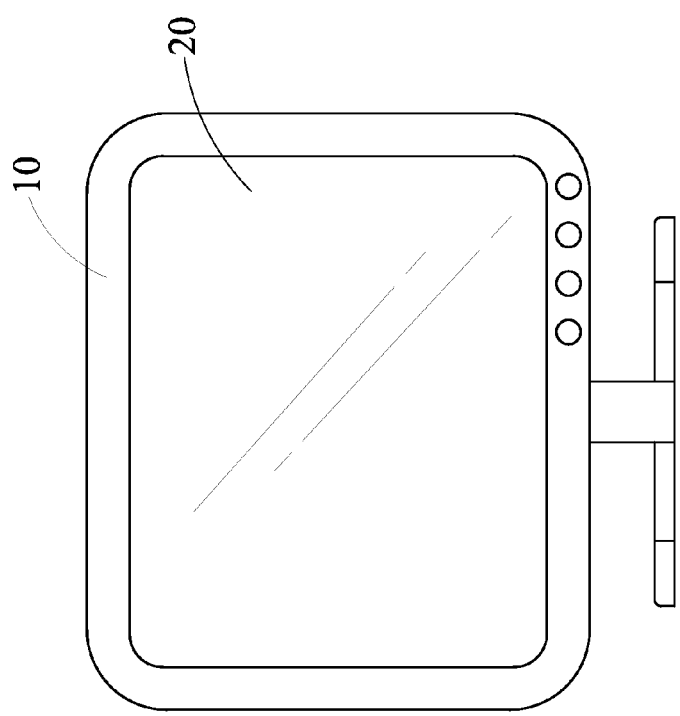
FIG. 11 schematically shows a display apparatus according to an embodiment of this disclosure.

FIG. 11 schematically shows a display apparatus 10 according to an embodiment of this disclosure. The display apparatus 10 includes a display panel 20 according to the above-recited embodiments. The display apparatus 10 can be a calculator with a monitoring screen, a mobile phone, a tablet computer, or a digital media frame with a controller integrated-circuit chip on a printed circuit board, but this disclosure is not limited thereto. The display panel 20 can be a liquid crystal (LC) display panel which includes a thin-film transistor (TFT) substrate, a color filter (CF) substrate, and a LC layer interposed therebetween. LCs are matter in a state that has properties between those of conventional liquid and those of solid crystal. LCs may be composed of crystal-like organic molecules, which can be orientated according to external electrical fields. This is the operational principle of the LC display. Furthermore, the display panel 20 can be an organic light-emitting diode (OLED) display apparatus which includes a TFT substrate, a cover substrate, and an OLED layer between the TFT and cover substrates. The display panel 20 can also be a plasma display panel (PDP). The display apparatus 10 can also be applied to the electronic products such as a television set, a personal computer, a monitoring screen, and a personal digital assistant (PDA).

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A display panel comprising:
   a substrate;
   a first electrode formed on the substrate;
   a first insulation layer formed on the first electrode;
   a gate electrode formed on the first insulation layer and having an inclined lateral plane;
   a second insulation layer formed on the gate electrode and covering the inclined lateral plane;
   an active layer formed on the second insulation layer corresponding to the inclined lateral plane and electrically connected to the first electrode; and
   a second electrode electrically connected to the active layer;
   wherein the inclined lateral plane has an angle of between 30 and 90 degrees relative to the surface of the substrate.

2. The display panel according to claim 1, wherein the second electrode is located between the second insulation layer and the active layer.

3. The display panel according to claim 1, wherein the active layer is located between the second insulation layer and the second electrode.

4. The display panel according to claim 1, wherein the active layer is formed of indium gallium zinc oxide (IGZO) or indium zinc oxide (IZO).

5. The display panel according to claim 1, further comprising a first via hole through the first insulation layer and the second insulation layer to expose the first electrode.

6. The display panel according to claim 1, further comprising:
   a third insulation layer formed on the second electrode and covering the active layer; and
   a pixel electrode formed on the substrate and covering the third insulation layer;
   wherein a second via hole penetrates through the third insulation layer to expose the second electrode, and the pixel electrode is electrically connected to the second electrode.

7. The display panel according to claim 1, wherein the gate electrode comprises a first gate metal layer, a second gate metal layer, and a fourth insulation layer between the first gate metal layer and the second gate metal layer.

8. A liquid crystal display (LCD) apparatus comprising a thin-film transistor substrate, an opposing color filter substrate, and a liquid crystal layer between the thin-film transistor substrate and the color filter substrate, the thin-film transistor substrate comprising:
   a substrate;
   a first electrode formed on the substrate;
   a first insulation layer formed on the first electrode;
   a gate electrode formed on the first insulation layer and having an inclined lateral plane;
   a second insulation layer formed on the gate electrode and covering the inclined lateral plane;
   an active layer formed on the second insulation layer corresponding to the inclined lateral plane and electrically connected to the first electrode; and
   a second electrode electrically connected to the active layer;
   wherein the inclined lateral plane has an angle of between 30 and 90 degrees relative to the surface of the substrate.

9. A organic light-emitting diode (OLED) display apparatus comprising a thin-film transistor substrate, an opposing cover substrate, and an OLED layer between the thin-film transistor substrate and the cover substrate, the thin-film transistor substrate comprising:
   a substrate;
   a first electrode formed on the substrate;
   a first insulation layer formed on the first electrode;
   a gate electrode formed on the first insulation layer and having an inclined lateral plane;

a second insulation layer formed on the gate electrode and covering the inclined lateral plane;
an active layer formed on the second insulation layer corresponding to the inclined lateral plane and electrically connected to the first electrode; and
a second electrode electrically connected to the active layer;
wherein the inclined lateral plane has an angle of between 30 and 90 degrees relative to the surface of the substrate.

* * * * *